US00RE45200E

(19) United States
(12) Reissued Patent
Chan

(10) Patent Number: US RE45,200 E
(45) Date of Reissued Patent: Oct. 21, 2014

(54) PROGRAMMABLE SIGNAL ROUTING SYSTEMS HAVING LOW STATIC LEAKAGE

(71) Applicant: Lattice Semiconductor Corporation, Hillsboro, OR (US)

(72) Inventor: Andrew Ka Lab Chan, Palo Alto, CA (US)

(73) Assignee: Lattice Semiconductor Corporation, Hillsboro, OR (US)

(21) Appl. No.: 13/764,221

(22) Filed: Feb. 11, 2013

Related U.S. Patent Documents

Reissue of:
(64) Patent No.: 7,911,229
Issued: Mar. 22, 2011
Appl. No.: 12/238,959
Filed: Sep. 26, 2008

(51) Int. Cl.
*H03K 19/177* (2006.01)
*H03K 19/00* (2006.01)

(52) U.S. Cl.
USPC ..... 326/41; 326/56

(58) Field of Classification Search
CPC ..... H04B 1/0003; H04B 1/28; H04B 1/406; H04B 15/02; H04B 15/04; H04B 2215/064; H04B 1/38; H04B 1/58; H04B 3/03; H04B 3/23; H04B 1/0007; H04B 1/0039
See application file for complete search history.

(56) References Cited

U.S. PATENT DOCUMENTS

| | | | | |
|---|---|---|---|---|
| 5,581,199 | A * | 12/1996 | Pierce et al. | 326/41 |
| 5,604,450 | A * | 2/1997 | Borkar et al. | 326/82 |
| 6,016,063 | A * | 1/2000 | Trimberger | 326/81 |
| 6,020,760 | A * | 2/2000 | Sample et al. | 326/41 |
| 6,476,636 | B1 * | 11/2002 | Lien et al. | 326/41 |
| 6,526,558 | B2 * | 2/2003 | Agrawal et al. | 716/16 |
| 7,236,010 | B1 * | 6/2007 | Keith | 326/41 |
| 7,468,974 | B1 * | 12/2008 | Carr et al. | 370/388 |
| 2003/0128052 | A1 * | 7/2003 | Cliff et al. | 326/41 |
| 2003/0214324 | A1 * | 11/2003 | How et al. | 326/41 |

* cited by examiner

*Primary Examiner* — Crystal L Hammond

(57) ABSTRACT

Parasitic static leakage current through input terminals of bus-accessing multiplexers is minimized by automatically forcing as many as practical of the bus lines into a high impedance state where all drivers of the lines are in a high impedance output state. Thus parasitic current sinking or current sourcing leakage paths through the bus-accessing multiplexers are cut off. The method is of particular utility in a low power FPGA that desirable has low static current leakage when in a static state.

49 Claims, 6 Drawing Sheets

MUX-INTENSIVE, LINE DRIVER INTENSIVE, CONFIG BIT INTENSIVE, SIGNAL ROUTING SYSTEM

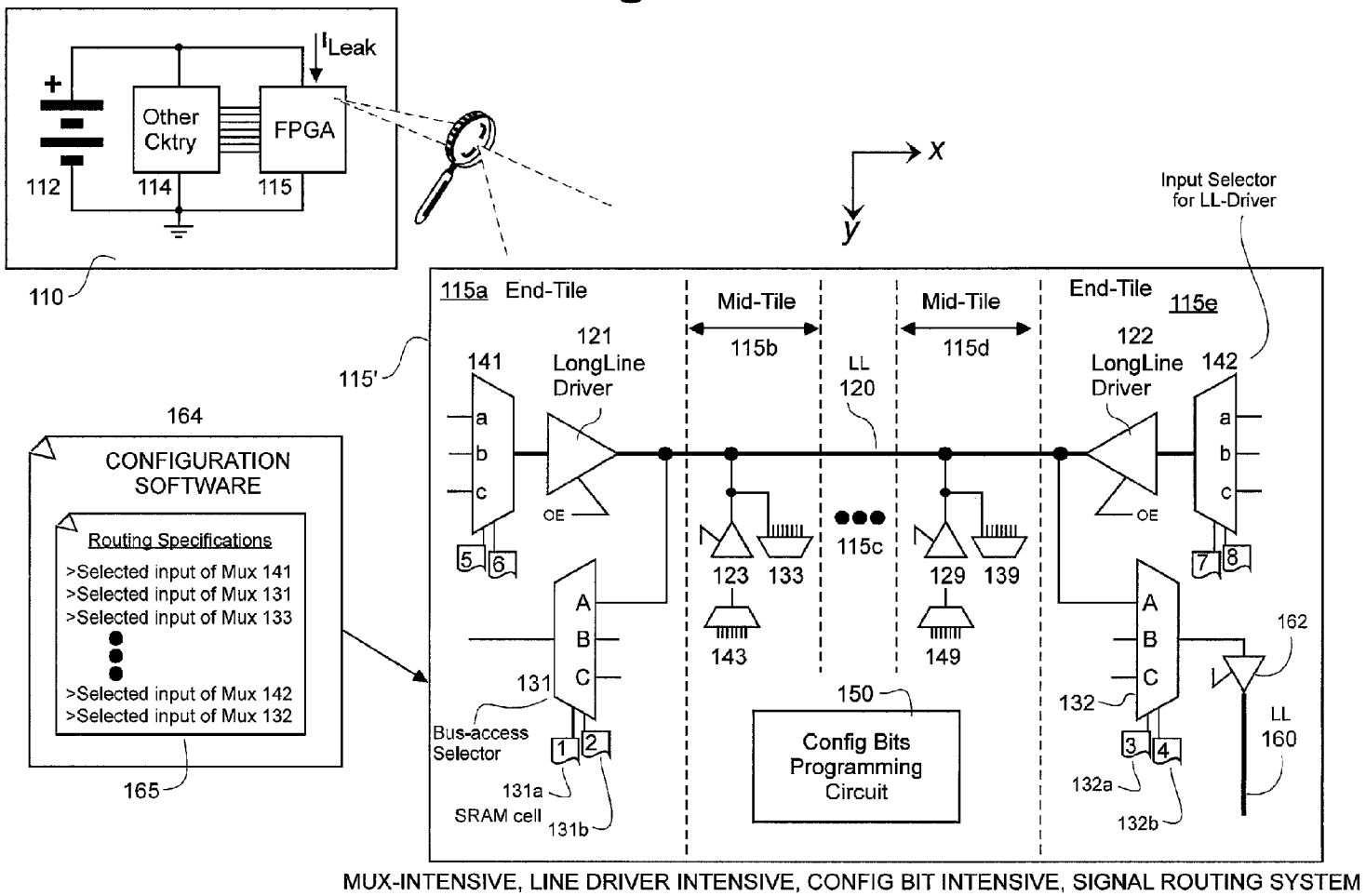
100
Fig. 1
$I_{Leak}$
FPGA
115
Other Cktry
114
112
110
115'
End-Tile
115a
141
a
b
c
5
6
121
LongLine Driver
OE
A
B
C
131
1
2
Bus-access Selector
131a
SRAM cell
131b
Mid-Tile
115b
123
133
143
LL
120
115c
Mid-Tile
115d
129
139
149
End-Tile
115e
122
LongLine Driver
OE
142
a
b
c
7
8
Input Selector for LL-Driver
A
B
C
132
3
4
132a
132b
162
LL
160
150
Config Bits Programming Circuit
X
Y
164
CONFIGURATION SOFTWARE
Routing Specifications
>Selected input of Mux 141
>Selected input of Mux 131
>Selected input of Mux 133
>Selected input of Mux 142
>Selected input of Mux 132
165
MUX-INTENSIVE, LINE DRIVER INTENSIVE, CONFIG BIT INTENSIVE, SIGNAL ROUTING SYSTEM 200
Primary Charging Current Path
Possible Static Leak Resistance
204
203
$C_{Load}$
202
201
232
TG-Sel
TG-Sel
TGD
TGA
TGB
TGC
TGX
TGE
"1"
"1"
"1"
Low-R
High-R
Input A
Input B
Input C
Input X
205
206
131e
Selection Decoding Circuitry
A B C X D E
Sel-1
Sel-2
Bus-access Selector
131'
A B C
1 2
231
Vcc
121'
OE
Non-Selected Input Terminals
131a'
SRAM cell 1
SRAM cell 2
131b'
131c
NVMem cell 1
NVMem cell 2
131d

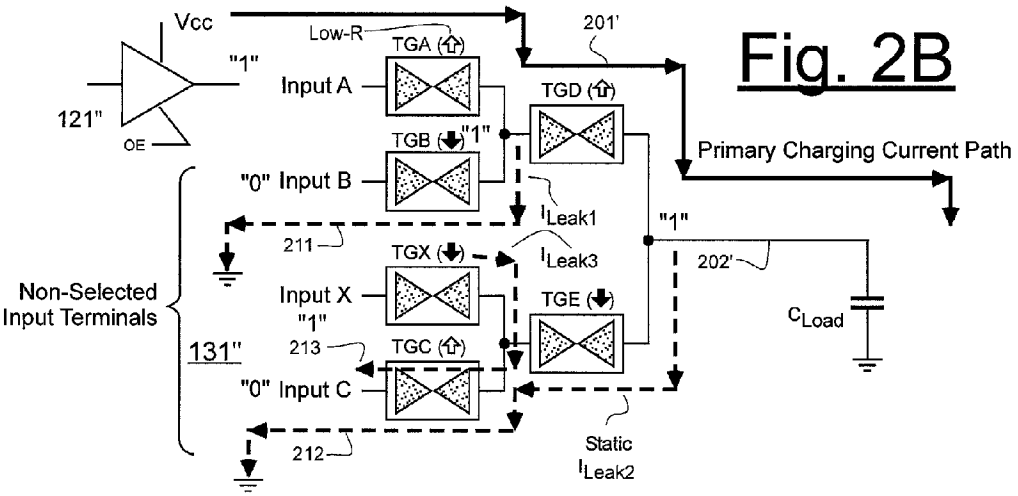
Fig. 2B
Primary Charging Current Path
201'
202'
"1"
$C_{Load}$
TGD
TGE
TGA
TGB
TGX
TGC
$I_{Leak1}$
$I_{Leak3}$
Static $I_{Leak2}$
Low-R
Input A
Input B
Input X
Input C
"1"
"0"
"1"
"0"
211
212
213
131'''
Vcc
OE
121'''
Non-Selected Input Terminals

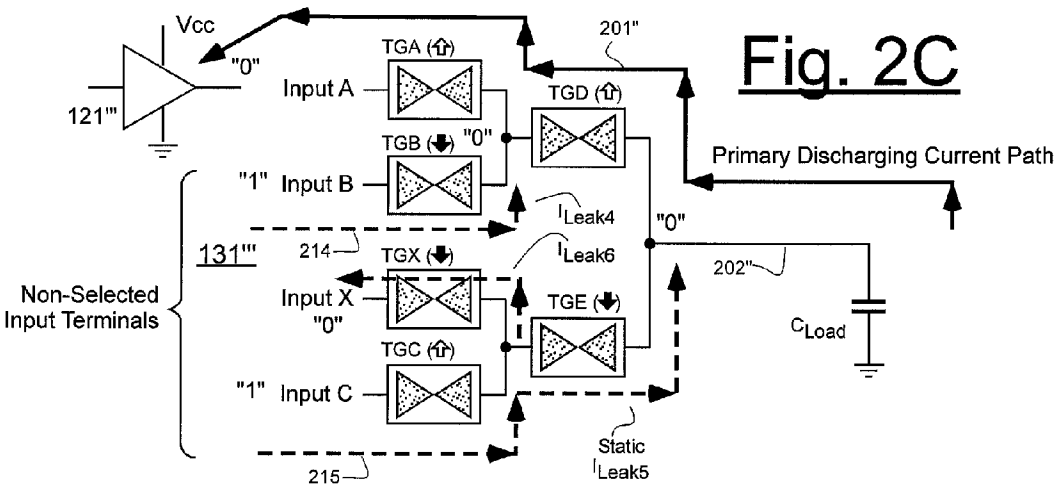
Fig. 2C
Primary Discharging Current Path
201''
202''
"0"
$C_{Load}$
TGD
TGE
TGA
TGB
TGX
TGC
$I_{Leak4}$
$I_{Leak6}$
Static $I_{Leak5}$
Input A
Input B
Input X
Input C
"0"
"0"
"1"
"0"
"1"
214
215
131'''
Vcc
121'''
Non-Selected Input Terminals

300

400

PROGRAMMABLE SIGNAL ROUTING SYSTEMS HAVING LOW STATIC LEAKAGE

Matter enclosed in heavy brackets [ ] appears in the original patent but forms no part of this reissue specification; matter printed in italics indicates the additions made by reissue.

FIELD OF DISCLOSURE

The present disclosure of invention relates generally to programmable signal routing systems such as found in field programmable gate arrays (FPGA's) or other programmable logic devices (PLD's). The disclosure relates more specifically to structures and methods for reducing static current leakage associated with such programmable signal routing systems.

DESCRIPTION OF RELATED TECHNOLOGY

A field programmable gate array (FPGA) device may be characterized as being constituted by a monolithic, integrated circuit (IC) that typically has four major features, namely: configurable logic blocks (CLB's), configurable signal routing interconnect, configurable input/output blocks (CIOB's) and configuration means for programmably configuring the CLB's, the interconnect and the CIOB's.

FPGA's may be designed for use in a variety of environments. One such environment calls for minimized power consumption at least when the FPGA is in standby mode. Heretofore, close attention has not been paid to DC power leakage (static leakage) attributed to the configurable signal routing interconnect of FPGA's and of like reconfigurable logic devices.

SUMMARY

Structures and methods may be provided in accordance with the present disclosure of invention for reducing static standby current leakage in configurable signal routing interconnect such as that of FPGA's.

In accordance with one aspect of the present disclosure, a leakage reducing method comprises: (a) structuring longline buses of an FPGA to have tristateable longlines and structuring the longline buses to each provide $2^n-1$ tappable lines in a given repeatable tile structure, where n is a whole number greater than 1; (b) structuring one class of longline accessing multiplexers of the FPGA to have $2^n-1$ input terminals and n selection control bits where for example a logical 0 . . . 0 selection permutation (all zeroes) does not select any of the $2^n-1$ input terminals (it could alternatively be an all 1's permutation or another unique permutation in which case appropriate changes are made to the following further steps); (c) for each longline, providing plural tristatable longline drivers to drive that longline and, during power-up or reset of the FPGA, globally forcing all such longline drivers into a high impedance (Hi-Z) output mode (global output disable); (d1) also on power-up/reset of the FPGA, globally resetting all configuration memory bits that control selection by input selecting multiplexers of longline drivers to the "0" logic state; (d2) optionally during power-up/reset of the FPGA, globally resetting all configuration memory bits that control selection by longline accessing (tapping) multiplexers to the "0" logic state; (e) logically ORring the configuration memory bits that control selection by each given longline driver input multiplexer and using the logical OR output to control a local output enable (OE) of the corresponding longline driver so that a 0 . . . 0 configuration (or other predefined unique permutation) of the memory bits that control selection by the respective input selecting multiplexer will disable output by the corresponding longline driver; (f1) determining which longlines will have to carry an active signal; (f2) selectively setting to the "1" logic state, one or more of the configuration memory bits of longline driver input multiplexers whose corresponding longline drivers will have to source an active signal onto a corresponding longline that is determined to have to carry an active signal; (f3) selectively setting to the "1" logic state, one or more of the configuration memory bits of longline accessing multiplexers that will receive a signal from a corresponding tappable longline whose longline driver input multiplexer has been or will be selectively activated by setting to the "1" logic state, one or more of its configuration memory bits; and (g) after configuration of the individual configuration memory bits completes, releasing the global forcing of all tristatable longline drivers to the Hi-Z state (deactivating global disable) and thereby allowing the local output enables (OE) to determine which longline drivers remain stuck in the Hi-Z state and which can source signals onto their respective longlines from which active signals will be tapped.

Other aspects of the disclosure will become apparent from the below detailed description.

BRIEF DESCRIPTION OF THE DRAWINGS

The below detailed description section makes reference to the accompanying drawings, in which:

FIG. 1 is an introductory block diagram of an FPGA system in accordance with the disclosure;

FIG. 2B shows how static leakage may occur when the longline driver of FIG. 2A is outputting a high signal ("1") and unselected input terminals of the longline bus accessing multiplexer are nonetheless actively driven to a certain permutation of low ("0") and high ("1") states;

FIG. 2C shows how static leakage may occur when the longline driver of FIG. 2A is outputting a low signal ("0") and unselected input terminals of the longline bus accessing multiplexer are nonetheless actively driven to a certain permutation of high ("1") and low ("0") states;

DETAILED DESCRIPTION

Figure 2A:
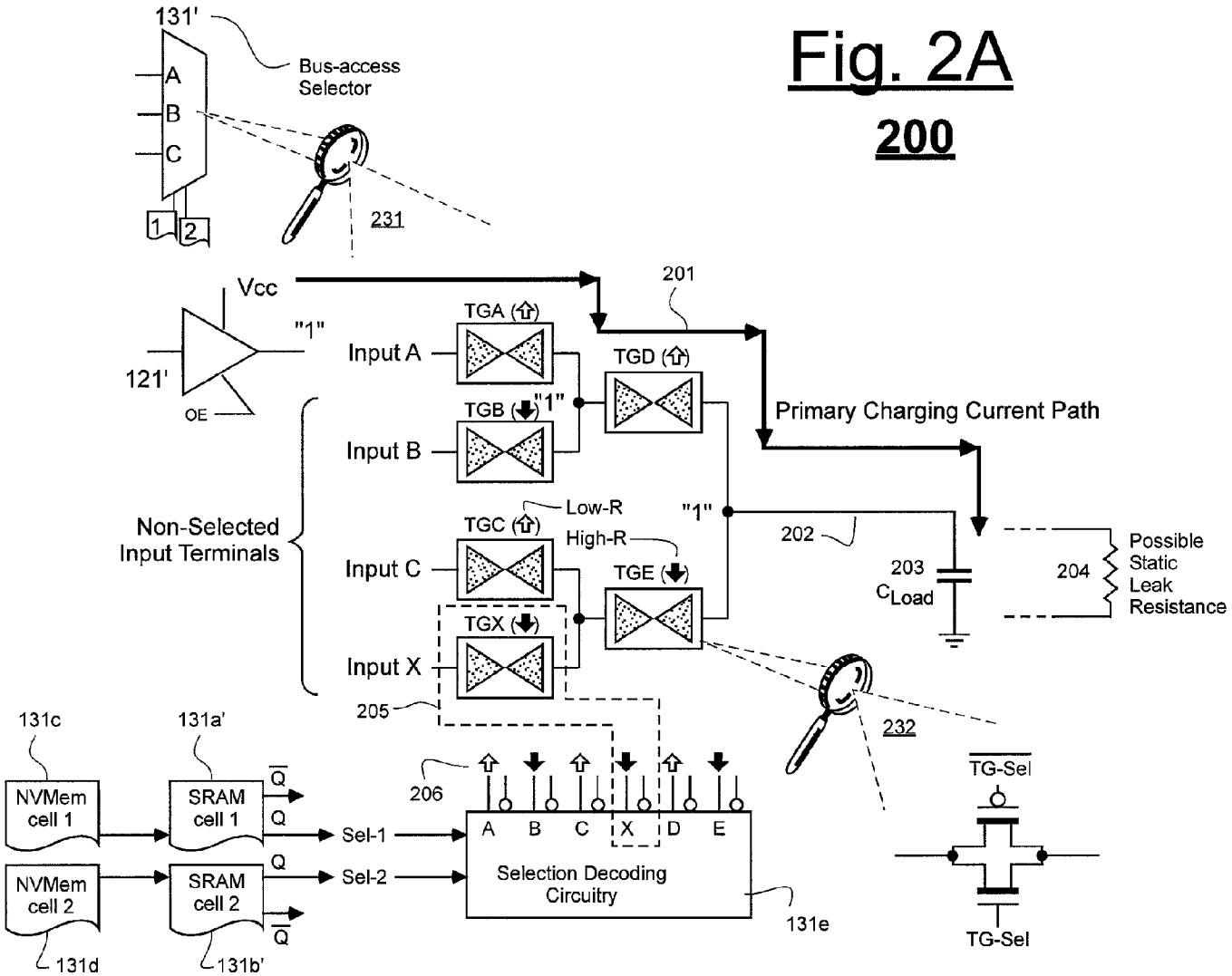
FIG. 2A is a schematic diagram showing details of interaction between one of the longline drivers of FIG. 1 and a corresponding longline bus accessing multiplexer.

FIG. 1 is a block diagram of an FPGA-based system 100 to which the here disclosed invention may be applied. In one embodiment, a miniaturized mobile device such as a third generation cellular telephone comprises a circuit supporting substrate 110 receiving power from a battery 112 of the mobile device and containing a low power FPGA 115 as well as other circuitry 114 external of and interoperative with the FPGA 115.

Magnification 115' shows part of an interconnect structure of the FPGA 115 for purpose of introducing some basic concepts. It is understood that FPGA 115 further includes configurable logic blocks (CLB's, not shown) and configurable input output blocks (CIOB's, not shown) as well as possible local interconnect structures, memory blocks, etc., which components are left out to avoid illustrative clutter in the introductory FIG. 1. The CLB, the configurable interconnect and other basic components of the FPGA are generally repeated in substantially similar and repeating tile structures distributed for example as an x and y matrix (not shown).

Within the configurable interconnect there is provided a first continuous conductor or "longline" (LL) 120, which in one embodiment is constituted by a continuous metal conductor. This first LL 120 is shown in FIG. 1 as extending from a first end-tile 115a to an opposed end-tile 115e where the longline 120 extends through a plurality of mid-tiles such as 115b-115d interposed between the first and second of its end-tiles, 115a and 115e. As understood by those skilled in the art, longlines have the capability of carrying signals over relatively long continuous distances within a programmable logic device, hence their name, longline. The configurable interconnect of the FPGA may have other types of shorter lines for providing short-haul interconnectivity between closely neighboring tiles. For sake of avoiding illustrative clutter in introductory FIG. 1, these are not shown.

Referring to the illustrated components within the first end-tile 115a of FIG. 1, the corresponding first end of longline 120 is driven by a first tristate longline driver 121 and the first end also connects to a first input (designated as capital "A" ) of a first longline bus-accessing multiplexer 131. Accessing multiplexer 131 has at least three input terminals (A, B, C) each connecting to a respective locally tappable longline in a longline bus (not shown) to which the first longline 120 belongs. To avoid illustrative clutter at this stage, other longlines of the bus are not shown (see briefly bus 420 of FIG. 4). The first bus-accessing multiplexer 131 further has two selection control terminals coupled to respective configuration SRAM cells 131a and 131b (also denoted as cells 1 and 2). The configuration of these memory cells 131a and 131b is controlled by a configuration-bits programming circuit 150 which configures the SRAM cells 131a and 131b during a power-up or reset phase of operation of the FPGA 115. As will be understood by artisans, there are four possibilities or permutations for the two cells: 00, 01, 10 and 11. The output terminal of multiplexer 131 extends to other circuitry within the first end-tile 115a. That other circuitry (not fully shown) can include another longline (e.g., similar to 160) extending in a direction (e.g., Y) different from the longitudinal direction (e.g., X) of LL 120 and/or extending through configurable tiles other than those spanned by LL 120. In addition to the Y-driving LL driver (similar to 162) outputs to the Y-directed LL (similar to 160), that other circuitry within tile 115a (not shown) can alternatively or additionally include a local CLB or an IOB or a memory block section corresponding to local tile 115a.

Within tile 115a, another multiplexer 141, namely an input selecting multiplexer is further provided for selecting an input signal to be applied to the input terminal of longline driver 121. In the illustrated example, inputting multiplexer 141 has three selectable input terminals (designated as lower case a, b, c) and selection of these is controlled by configuration memory cells numbered as 5 and 6. The first longline driver 121 has an output enable terminal (OE) for controlling the state of its output to be either in an active driving mode or a high impedance (Hi-Z) mode.

The opposed end-tile, 15e at the other end of LL 120 is similarly structured to include a second longline driver 122, a second longlines bus-accessing multiplexer 132 (accessing LL 120 among others) and a second driver input selecting multiplexer 142. The selection bits of multiplexer 132 are designated as 3 and 4 while the configuration bits of multiplexer 142 are denoted as 7 and 8. In one possible embodiment, further configuration bits denoted as 9 and 10 (not shown) might have been used to control the OE terminals of drivers 121 and 122 although such additional configuration bits do not appear in this illustrated embodiment. The point to be made by this is that there can be large numbers of configuration bits (e.g., 1, 2, . . . , 8 and optionally 9-10) associated with each longline (e.g., 120) and since the longlines generally repeatedly appear throughout the FPGA within buses having many alike longlines, the total number of configuration bits used in an FPGA 115 for managing longline operations can be quite large. This can place a burden on the configuration-bits programming circuit 150 which must correctly program all of these bits in relatively short time when the FPGA is first powered up or is otherwise reset. It will be seen below how a number of longline managing problems can be simultaneously taken care of with a single global reset of the FPGA configuration bits (e.g., 1, 2, . . . , 8, etc.).

In one embodiment, each of longline drivers 121 and 122 is structured to source a relatively large charging current onto longline 120 and to sink a relatively large discharging current from longline 120 so as to thereby compensate for relatively large capacitive loadings that tend to appear along LL 120. For example, in one embodiment longline driver 121 has a CMOS output stage including two NMOS output transistors each having a width of 4 μm and a PMOS output transistor having a width of 7 μm. Ordinary logic transistors in the same embodiment have channel widths of about 0.5 μm. So the LL driver transistors are about an order of magnitude wider. In one embodiment, the number of middle-tiles 115b-115d is eleven and the longline 120 is referred to as a 12-span longline because it reaches from the first end-tile 115a (not counted) into twelve additional tiles 115b-115e. In other words, LL 120 of this embodiment extends into or through a total of 13 tiles. Other spans may be used which are shorter (e.g., 8-span) or longer (e.g., 16, 20, 24-span, etc.) than the 12-span example.

Each of the mid-tiles (e.g., 115b) may include its own longlines bus-accessing multiplexer (e.g., 133) similar to 131. Each of the mid-tiles may further include its own longline tristate driver (e.g., 123) similar to 121 except that it is a middle-of-line-driving driver rather than an end of line one. Additionally, each of the mid-tiles may include an input selecting multiplexer (e.g., 143) for its corresponding longline driver similar to the input selector 141 of tile 115a. Moreover, each tile may include multiplexers (not shown) which are associated with local interconnect and these additional, general interconnect multiplexers (or G-muxes) may be structured differently than the longlines bus-accessing multiplexers (e.g., 131, 133) shown in FIG. 1.

Configuration of the various input selecting multiplexers (e.g., 141-143, . . . , 149), of the OE terminals of the corresponding longline drivers (e.g., 121-123, . . . , 129), and of the various bus-access selecting multiplexers (e.g., 131-133, . . . , 139) may follow any of a large number of possible permutations. Although in the general case, it is possible to have a longline (e.g., 120) whose longline drivers (e.g., 121-123, . . . 129) are all rendered to be active (on a mutually exclusive basis) as opposed to being permanently held in the Hi-Z state for a given programming of the FPGA 115, the more common case is one where only a single of longline drivers 121-123, . . . , 129 is active on its respective longline (120) and all of the other drivers will remain in the Hi-Z mode for the duration of a given configuration. Moreover, even through it is theoretically possible to have all of the longline bus-accessing multiplexers 131-133, . . . , 139 active and accessing a signal from a given one longline (e.g., 120), it is more often the case that all but one or two of these longline tapping multiplexers 131-133, . . . , 139 are inactive and not being used for tapping a signal off the corresponding longline. If the unused bus-accessing multiplexers 131-133, . . . , 139 load the longline 120 either dynamically (as capacitive loads) or statically (as static leakage loads—to be explained shortly) this can be a problem.

Soon after the FGPA 115 is powered-up or reset, a configuration bits programming circuit 150 within the FPGA is automatically activated and it begins to selectively set each of the configuration SRAM cells 131a, 131b, etc., that need to be so set to the logic "1" state in accordance with externally provided configuration data 164. In one particular embodiment, all SRAM cells including 131a, 131b, 132a, 132b etc. are automatically reset to the logic "0" state before the configuration bits programming circuit 150 is activated to selectively set a subset of those configuration SRAM cells. The configuration data 164 generally includes a routing specification section 165 which instructs the configuration bits programming circuit 150 with regards to which, if any, of the driver input selecting multiplexers 141-143, . . . , 149 should be configured to have an active input and if so which input terminal should be enabled. It also instructs the configuration bits programming circuit 150 with regards to which of the bus-accessing multiplexers 131-133, . . . , 139, if any, should be configured to have an active input and if so, which input terminal should be enabled; and so forth. In general it may be seen from FIG. 1 that structure 115' can have large numbers of configurable multiplexers for each longline (e.g., for LL 120), large numbers of configurable tristate buffers connected to drive each longline, and a corresponding large number of configuration bits which need to be appropriately set or reset in order to define the signal routing functions performed by each of the longlines (e.g., 120) and its associated interconnect components (e.g., 141, 121, 131, etc.).

A number of considerations are worthy of closer study with regard to the design and use of the routing structure shown in box 115'. More specifically, one question is whether it is possible to minimize the time and power consumed by the configuration bits programming circuit 150 as it goes about configuring the many configuration bits of the routing structure 115' and if so, how can this be done efficiently? A second question is whether it is possible to manage configuration of the bits so that static current leakage ($I_{LEAK}$) can be minimized while the FPGA 115 is in a low power standby mode and if so, how can this be done efficiently? The second question is particularly important when the FPGA 115 is used in a battery powered, miniaturized mobile circuit environment such as that of circuit 110 (e.g., cell phone, personal digital assistant, palm top computer, etc.).

FIG. 2A shows in a first magnification area 231, one possible implementation for a bus-accessing multiplexer such as 131'. Here, a plurality of bidirectional transmission gates, TGA-TGE, are organized in a tree-like structure to selectively route a signal from one of the four input terminals, namely, Input-A to Input-X to the multiplexer's output terminal, 202. A possible internal structure for each transmission gate (TG) is shown in second magnification area 232. The exemplary transmission gate comprises back-to-back NMOS and PMOS transistors. The NMOS transistor receives a transmission gate select signal (TG-Sel) and the PMOS transistor receives the inverse of the same transmission gate select signal (TG-Sel*). In an alternate embodiment, bus-accessing multiplexer 131' might use pass transistors instead of TG's. However, in the pass transistor case it may be necessary to use enhanced gate drive voltages to overcome a threshold drop problem.

Multiplexer 131' is further shown in FIG. 2A to include a selection decoding circuit 131e having a plurality of transmission gate control lines corresponding to the TG-Sel and their inverses (TG-Sel*) of the transmission gates TGA-TGE and understood to extend to the respective transmission gates TGA-TGE. The selection decoding circuit 131e is driven by selection input bits, Sel-1 and Sel-2. The latter two selection bits are output as the Q outputs from respective SRAM cells 131a' and 131b'. In one embodiment, SRAM cells 131a' and 131b' also have Qbar outputs coupled to the selection decoding circuit 131e. In one embodiment, the selection decoding circuit 131e is simply a plurality of conductors that cause transmission gates TGA and TGC to be in a same state (either conductive Low-Resistance or relatively non-conductive High-Resistance) depending on the state of the Sel-1 line and cause TGB and TGX (assuming TGX is present) to be in a same opposite state (e.g., Low-R if TGA and TGC are in Hi-R state). For that same simple embodiment, decoding circuit 131e causes the second column of transmission gates, TGD and TGE to be in opposite states from one another depending on the state of the Sel-2 line (e.g., TGD is in Low-R state while TGE is in Hi R state if Sel-2="0"). Thus selection is provided simply by routing the Q and Qbar outputs of SRAM cells 131a' and 131b' to the appropriate TG-Sel and TG-Sel* terminals of transmission gates TGA-TGE. In one embodiment, the following input terminals are selected according to their parenthetically expressed selection codes: X(00), C(01), B(10) and A (11).

In an alternate embodiment, the selection decoding circuit 131e can be more complex and structured for example to cause all but one of the first column transmission gates, TGA, TGB, TGC, TGX to be in a substantially non-conductive High-Resistance state in response to 01, 10, 11 and 00 permutations of the Sel-1 and Sel-2 bits. If the TGX transmission gate is left out of the circuit where TGX is selected in response to the 00 permutation of Sel-1 and Sel-2, then all first column transmission gates, TGA, TGB, TGC are in a substantially non-conductive High-Resistance state in response to the 00 permutation. Various combinatorial logic designs may be used to realize such an outcome.

In one embodiment, SRAM cells 131a' and 131b' are respectively configured according to configuration data loaded from nonvolatile memory cells 131c and 131d. In one embodiment, the nonvolatile memory cells 131c and 131d are provided on a same monolithic circuit substrate (e.g., silicon) as is the rest of the FPGA circuitry. Multiplexer output terminal 202 couples to a capacitive load 203 ($C_{Load}$). In some implementations it is possible for there to be a parasitic static leakage resistance 204 provided across the capacitive load 203. In general, the static leakage resistance 204 of the load is negligible. However, even if the load leakage resistance 204 is present to a non-negligible extend, there are other potential parasitic leakage paths that can pose a greater problem.

For purpose of illustrating the potential leakage paths, it is assumed here that selection decoding circuit 131e has selected Input-A to be the used input terminal that routes its respective input signal to output terminal 202. That means, for the simple decoding embodiment of circuit 131e that TGA is driven to a Low-R state (signified by the white up arrow) and TGD is also driven to a Low-R state thus providing a Low-Resistance path from the input-A terminal to output terminal 202. At the same time, TGB, TGX and TGE are driven to the Hi-R state (signified by the dark filled down arrow). TGC is driven to a Low-R state (signified by the wide up arrow). The respective activations of TGA, TGB, TGC, TGX, TGD and TGE are further shown at 206 by way of the respecting white up (ON) and dark down (OFF) arrows.

It is further assumed for purpose of illustration that Input-A is being driven by a logic "1" output from tristate driver 121'. Tristate driver 121' internally provides a low resistance path from its +Vcc power terminal to its output terminal when generating the logic "1" output. Since selection decoding circuit 131e causes transmission gates TGA and TGD to operate in their conductive or low resistance states, a primary charging current 201 can easily flow from the Vcc terminal of driver 121', through its output, through the Input-A terminal, through corresponding transmission gates TGA and TGD and then through the output terminal 202 for thereby charging the load capacitance 203 to the logic "1" state. At the same time, since High-R states are present along the paths linking to the multiplexer output node 202 from the remaining input terminals of multiplexer 131', namely Input B, Input C and Input X, these input terminals are conventionally seen having not been selected and the input signals provided at those terminals are ignored. In one embodiment, multiplexer 131' has only three input terminals, A, B and C; and transmission gate TGX is intentionally left out (for reasons that will become apparent below). In such a case the circuitry of dashed box 205 is removed.

Referring to FIG. 2B, consideration will now be undertaken as to what happens with regard to static leakage current under the condition that non-selected input terminals, Input-B and Input-C are each receiving a logic "0" and thus providing a current path to ground while Input-X receives a logic "1". Note that in FIG. 2B the positions of TGX and TGC have been swapped (to simplify the illustration of leakage path 212). Recall that a low resistance conduction path 201' has been formed between the Vcc terminal of driver 121' and the output terminal 202' passing through transmission gates TGA and TGD. Recall also that the non-selected transmission gates TGB and TGE exhibit a relatively high but nonetheless not infinite, resistance. Since there is a driven "1" at the right side of TGB and a grounding "0" at its left side, a first parasitic static leakage current 211 can flow from the +Vcc power rail of driver 121", through turned-on (Low-R) transmission gate TGA, and then through non-selected transmission gate TGB to the effectively grounded Input-B terminal. While the magnitude of this first leakage current 211 (also $I_{Leak1}$) may be small, the duration of its flow may be indefinitely long and thus the amount of energy lost may be significant. Moreover, there will be numerous duplicates of this $I_{Leak1}$) current in the many other longline bus-accessing multiplexers of the FPGA 115 and these will add up.

Yet another static leakage current 212 can flow from the power rail +Vcc terminal through the turned on transmission gates, TGA and TGD, followed by a continued flow through the High-R transmission gate, TGE and then out to ground view the turned on TGC. Yet a third static leakage current 213 ($I_{Leak3}$) can flow from the power rail +Vcc terminal of the driver (not shown) applying a "1" to the input of TGX and then to the grounded Input-C terminal of TGC. These static leakage currents 211, 212 and 213, are DC currents which can flow all of the time while respective Inputs B and C are held at the "0" state and A and X are held at the "1" state. Of course, if input terminals B, C and X were instead all held at the "1" state while input A is also held at the "1" state, then leakage currents 211, 212 and 213 would not flow. Moreover, if TGC were instead placed in a High-R state, the total amount of leakage would be reduced. Better yet though, if the connection lines connecting to the Input-B, Input-C and Input-X terminals were all in a high impedance (Hi-Z) state rather than grounded or raised to "1", then the static leakage currents 211, 212 and 213 would be substantially reduced. Accordingly, it is seen from close consideration of FIG. 2B that a maximum amount of static leakage current can flow when the selected input terminal A is driven to a logic high ("1") and the B and C input terminals are simultaneously driven low ("0") and the X input terminal is simultaneously driven high ("1"). On the other hand, static leakage current can be minimized if the other input terminals, B, C and X are simultaneously held in the Hi-Z state at least when the selected input terminal A is driven to a logic high ("1").

Referring to FIG. 2C, shown is the inverse case where the Input-A driver 121'" is active and sinking its output terminal to the logic "0" level (essentially ground). This then essentially grounds the selected input terminal A of transmission gate TGA. Transmission gates TGA, TGC and TGD still in low resistance or conductive states here while remaining transmission gates TGB, TGX and TGE are in de-selected or high resistance states. As illustrated, this condition allows a primary discharging current 201" to flow from the load capacitance $C_{Load}$ through output terminal 202" through TGD and TGA to the output terminal of driver 121'" and from there to the ground power rail of driver 121'" by way of an internal low resistance path inside driver 121'". Output terminal 202"" of FIG. 2C thereby obtains and maintains the "0" state.

If the non-selected input terminals, B and C are actively driven to a logic high ("1") state at the same time, then corresponding leakage currents heading towards the ground terminal of driver 121'" may occur. More specifically a first static leakage current 214 is shown flowing from Input-B through TGB (in High-R state), through TGA (in Low-R state), through Input-A and ultimately into the ground terminal of driver 121'". Similarly, another such static leakage current 215 can flow from a driven high ("1") at input terminal C, through TGC, TGE, TGD, TGA and finally towards the ground terminal of driver 121'". Moreover, a third leakage current $I_{Leak6}$ can flow to the driven low ("0") at input terminal X, from the driven high ("1") input of TGC. As may be appreciated from FIGS. 2B and 2C, static leakage currents can be minimized if all the non-selected input terminals (input lines) of every multiplexer are placed in the high impedance (Hi-Z) mode. Alternatively or additionally, if transmission gate TGX were removed from the multiplexer structure, that would eliminate leakage current paths for $I_{Leak3}$ and $I_{Leak6}$. Alternatively or additionally, if transmission gate TGC were forced into a High-R state when input-A is selected, that would reduce leakage currents, $I_{Leak2}$ and $I_{Leak5}$. Thus a number of cumulative and/or alternative methods may be used to eliminate and/or reduce static leakage currents.

It may also be appreciated from FIGS. 2B and 2C that static leakage currents may be maximized when, in the case of FIG. 2B, a certain first permutation of 0's and 1's (B=0, X=1, C=0) is presented at the non-selected input terminals (B–X) and in the case of FIG. 2C, a certain second permutation of 0's and 1's (B=1, X=0, C=1) is presented at the non-selected input terminals (B–X). Accordingly, in order to reduce or minimize static leakage, the leakage maximizing input states should be avoided where practical. Better yet, unused input terminals of used multiplexers should be coupled, where possible, only to drivers in the Hi-Z state and all or a substantial number of transmission gates (TG's) in unused multiplexers should be switched into high resistance state (Hi-R) so as to cut down the number of available leakage paths that have relatively small resistances (e.g., those that have only one Hi-R transmission gate in a path between ground and Vcc). It will now be explained how one or more of these leakage reducing conditions may be obtained.

Figure 3:
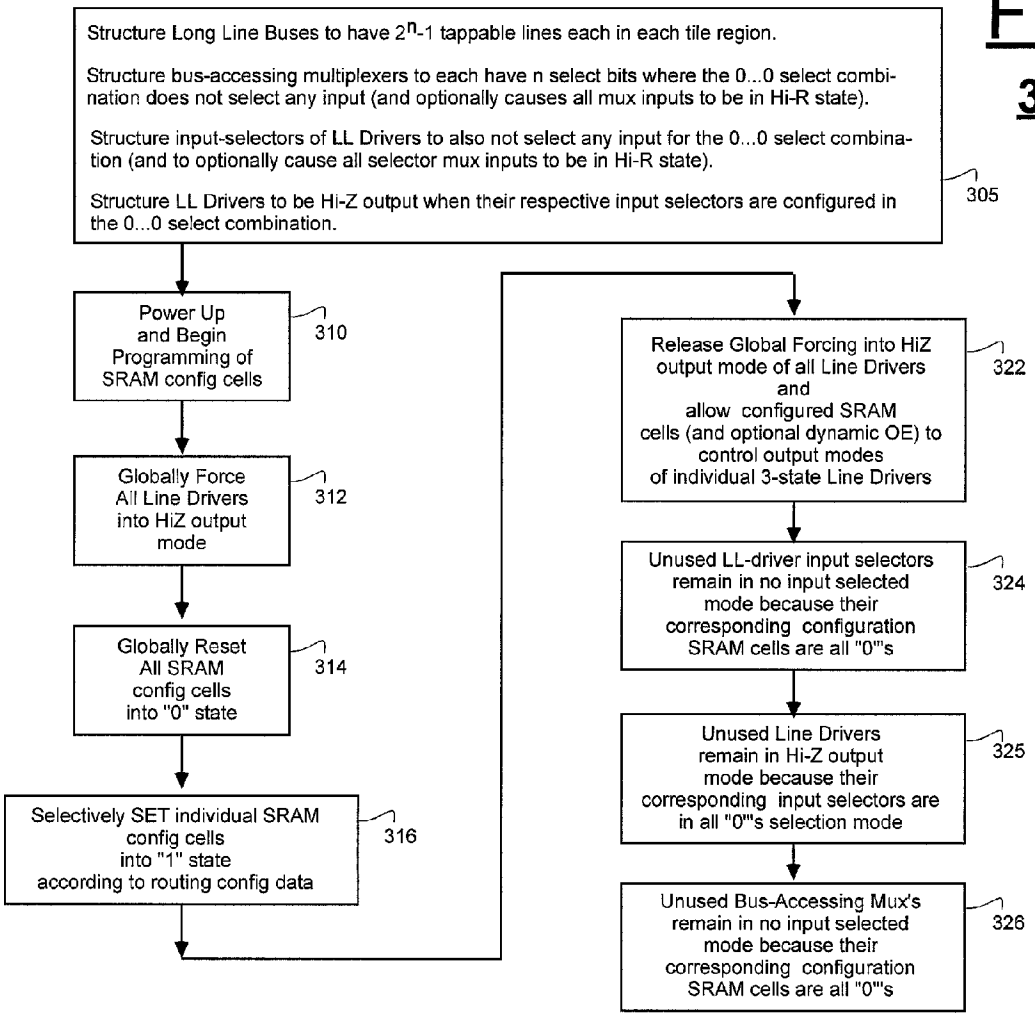
FIG. 3 is a flow chart of a leakage reducing method in accordance with the disclosure.

Referring to FIG. 3, a combined architecture and method 300 for reducing static leakage current is detailed by way of a flow chart. In architecture design step 305, all longline buses of an FGPA or of an alike programmable logic device (PLD) are structured to consist of $2^n-1$ tappable longlines in each bus-accessing region (e.g., in each of repeated FPGA tile regions), where the value of n for a given bus is a whole number greater than one. The number n does not have to be the same for each type of longline bus. For example, different types of longline buses may be structured to respectively consist of 3 tappable longlines (per region) in each LL bus of a first type, 7 such longlines in each LL bus of a second type, 15 such longlines in each LL bus of a third type, and so on; as opposed to the conventional powers-of-two numbers of lines, e.g., 4, 8, 16, etc., used for conventional longline buses.

In one embodiment, the number of longlines in each longline bus is more that $2^n-1$ and line positions are rotated upon crossover from one tile region to the next so that different ones of the longlines appear as the tappable $2^n-1$ subset of the bus for each tile region. In other words, only the tappable $2^n-1$ subset may be selectively tapped by corresponding bus-accessing multiplexers within that tile. This concept about having a tappable subset of $2^n-1$ lines within each tile and rotating the tappable subset upon spanning from one tile to the next tile can be confusing at first and may take away from understanding of the basic concept. So for now it is best to think of each longline bus as consisting of only $2^n-1$ longlines.

Additionally in architecture design step 305, each bus-accessing multiplexer is structured to have a similar number, $2^n-1$ of selectable input terminals provided thereon for selectively accessing one of the $2^n-1$ tappable longlines of a corresponding passing by longline bus in the respective tile. The bus-accessing multiplexer is further structured to have n selection defining terminals thereon for specifying which of its $2^n-1$ input terminals will be used to tap a signal form one of the $2^n-1$ tappable longlines of the corresponding bus. The all zeroes selection combination ("0 . . . 0") of the bus-accessing multiplexer is decoded to not select any of the input terminals. In one embodiment, the all zeroes selection combination ("0 . . . 0") of the bus-accessing multiplexer is specially decoded (e.g., by circuit 131e of FIG. 2A) to cause a presentation of a high resistance (Hi-R) at all of the $2^n-1$ input terminals of the bus-accessing multiplexer so to thereby reduce conductivity of possible leakage paths. In an alternate or same embodiment, the all zeroes selection combination ("0 . . . 0") is specially decoded (e.g., by circuit 131e of FIG. 2A) to place into the Hi-R mode at least the output transmission gate (or pass transistor) connected to the respective output terminal of the bus-accessing multiplexer if not to put into the Hi-R mode all of the transmission gates (or pass transistors) inside the bus-accessing multiplexer so as to thereby reduce conductivity of possible leakage paths.

Additionally in architecture design step 305, each input-selecting multiplexer that selects an input signal for input into a corresponding longline driver is structured so as not to select any of the inputs for the 0 . . . 0 selection control combination.

Figure 4:
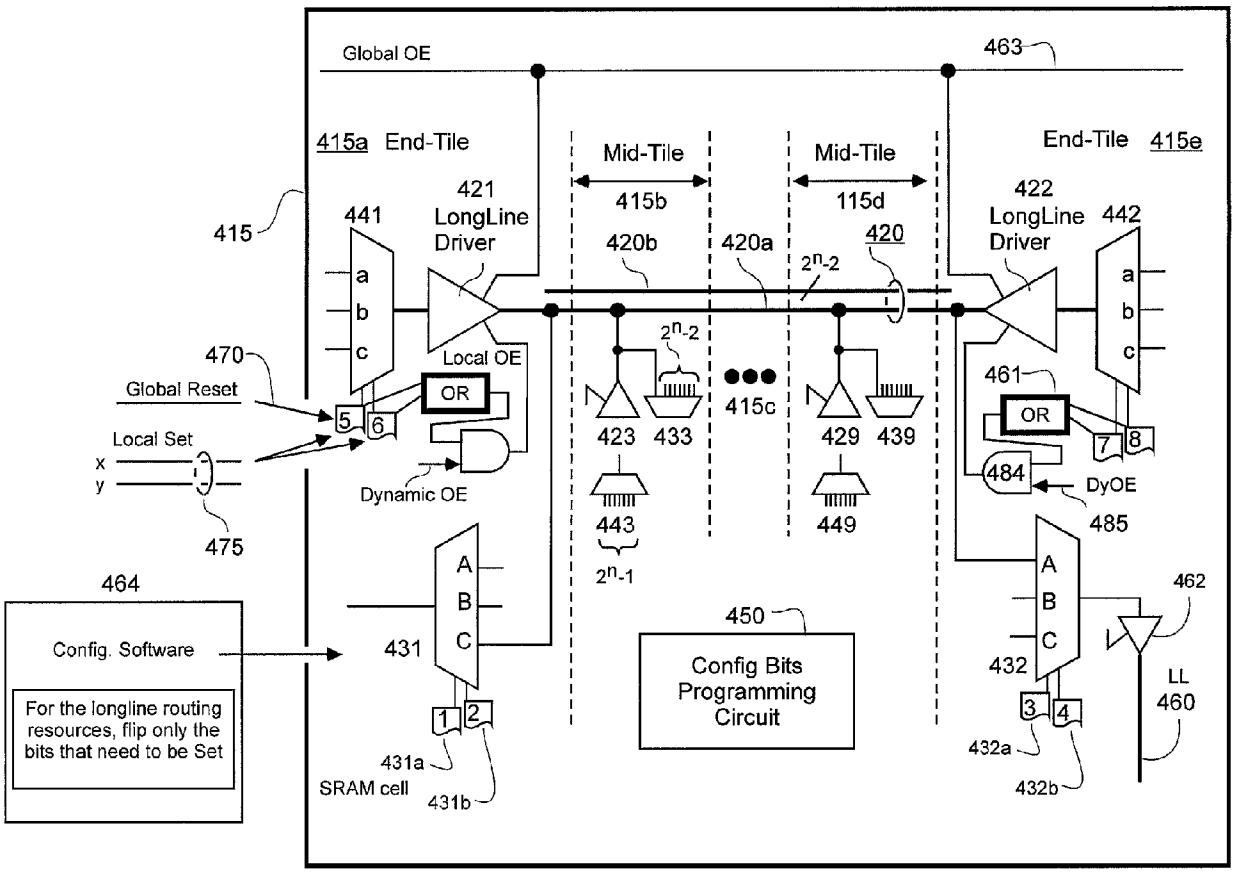
FIG. 4 is a schematic diagram of leakage reducing interconnect system that can be used in combination with the method of FIG. 3.

Moreover in architecture design step 305, the local output enable of each longline driver (e.g., 421 of FIG. 4) is controlled at least by the setting of the input selecting bits of the corresponding input-selecting multiplexer (e.g., 441 of FIG. 4) for that driver so that the output of that longline driver is forced into the Hi-Z mode if the selection bits of its corresponding input-selecting multiplexer are all zeroes ("0 . . . 0"). It is to be noted that an input-selecting multiplexer corresponding to a first longline driver can also be a bus-accessing multiplexer for a longlines bus driven by other longline drivers. In other words, a same one multiplexer can be both an input-selecting multiplexer and a bus-accessing multiplexer. For example, multiplexer 432 of FIG. 4 is an input-selector for LL driver 462 (which drives LL 460) as well as being an access selector that taps into a tappable portion within tile 415e of bus 420.

In step 310 the so architecturally structured FPGA or other PLD of step 305 (e.g., a PLD that includes one or more FPGA's) is powered up or otherwise reset. In response, it begins an automatic programming of its SRAM configuration memory cells. First however, in step 312, the rebooting PLD has all of its longline drivers globally forced into a high impedance (Hi-Z) output mode. Then in step 314 all of the SRAM configuration memory cells of the PLD are globally reset into the "0" state. As a result of this global reset, all of the bus-accessing multiplexers and input-selecting multiplexers (where a given multiplexer can be both types) of step 305 are forced into their no-input selected state (which could also be a high resistance for all input terminals state and/or a high resistance output state). Moreover as a result of step 314, all the longline drivers of step 305 are driven towards being in their Hi-Z output states due to their input-selecting multiplexers currently having the all zeroes (0 . . . 0) selection control combination applied to them.

In step 316, selected ones of the globally reset SRAM configuration memory cells are flipped or set into the logic "1" state. This is done in accordance with routing configuration data provided by configuration data such as 165 of FIG. 1. In one embodiment, the configuration data 164/165 is stored in an on-chip nonvolatile memory block and is transferred to on-chip SRAM configuration memory cells during step 316. At the conclusion of step 316, all the tristate longline drivers that will not be used because their input selection multiplexers have been initialized to the 0 . . . 0 state (and not switched into a different selection state thereafter) will remain in the Hi-Z mode—even after the global output disable is de-asserted. At the conclusion of step 316, only the tristate longline drivers that are to be actively used because their input selection multiplexers have been purposefully initialized to a selection control state other than the 0 . . . 0 state will be able to switch out of the Hi-Z mode into a possible other drive mode (after the global output disable is de-asserted in next step 322).

In subsequent step 322, after selective settings of the individual SRAM configuration cells is completed in accordance with the supplied routing configuration data 165, the global forcing of the tristate drivers into the Hi-Z output mode is released. This allows the individually configured SRAM configuration cells of respective input-selecting multiplexers to take over control the output modes of the corresponding individual tristate line drivers. In one embodiment the line drivers may also be controlled by optional dynamic output enable signals supplied locally to them. (See briefly DyOE 485 of FIG. 4.)

Referring to resultant state 324, the input-selecting multiplexers of all unused longline drivers will continue to remain in the no-input selected state because their corresponding configuration SRAM cells are still left as all zeroes (0 . . . 0). For one class of embodiments that means that at least all input transmission gates (e.g., TGA, TGB and TGC of FIG. 2A—TGX is typically not present) are in a High-R state and/or all output transmission gates (e.g., TGD, TGE of FIG.

2A) are in a High-R state and thus conductivities of static leakage paths through such unused multiplexers are reduced or minimized.

Referring to resultant state 325, all unused longline drivers of the routing system will remain in the Hi-Z mode after the global output disable is de-asserted because their corresponding input-selecting multiplexers are still in the all zeros (0 . . . 0) configuration state. As a result, longline connections to unselected input terminals of bus-accessing multiplexers will generally provide Hi-Z states and thus avoid providing parasitic static leakage paths of the kind shown in FIGS. 2B and 2C.

Moreover, as shown in resultant state 326, all of the unused bus-accessing multiplexers will continue to remain in the no-input selected state because their corresponding configuration SRAM cells are still left as all zeroes (0 . . . 0). For one class of embodiments that means that at least all input transmission gates (e.g., TGA, TGB and TGC of FIG. 2A—TGX is typically not present) are in a High-R state and/or all output transmission gates (e.g., TGD, TGE of FIG. 2A) are in a High-R state and thus conductivities of static leakage paths through such unused multiplexers are reduced or minimized. This reduces both dynamic and static loading on the corresponding longlines.

Referring to FIG. 4, shown is a PLD routing structure 400 that may be used in conjunction with the method 300 of FIG. 3. FIG. 4 corresponds to FIG. 1 and where practical, similar reference numbers in the "400" century series are used in place of counterparts in the "100" century series to represent similar elements. As such a detailed re-explanation of similar elements is not provided for FIG. 4.

Worthy of note in FIG. 4 are the logic OR circuits such as 461 which logically OR together the configuration memory bits (e.g., 7 and 8) of the corresponding input-selecting multiplexer (e.g., 442) for a given LL driver so as to force the corresponding longline driver (e.g., 422) into the Hi-Z state when the all zeroes (0 . . . 0) selection permutation is present for the corresponding input-selecting multiplexer (442). Additionally a global output enabling line 463 is provided across system 400 for forcing all longline drivers such as 421-423 . . . 429 into the Hi-Z mode when the global output enable is not asserted (in other words, a global output disable is asserted). Optionally, a dynamic output enable such as DyOE signal 485 may be provided for each individual longline driver by way of an AND gate such as 484 which is shown as provided in combinatorial series with OR gate 461. AND gate 484 may also receive as a third input, the global output enable (GOE) signal 463. If the DyOE signal is not used it (485) is forced high ("1").

Additionally FIG. 4 shows that in one embodiment, each longline bus 420 (having LL 420a and additional longlines 420b) consists of $2^n-1$ tappable longlines in each FPGA tile region and that each corresponding bus-accessing multiplexer (e.g., 433) also has $2^n-1$ input terminals connected for selectively tapping one of the $2^n-1$ tappable longlines of the corresponding FPGA tile region. The 0 . . . 0 input combination is reserved for not selecting any of the $2^n-1$ input possibilities. (Once again, in an alternate embodiment, each longline bus (e.g., 420) may have more than $2^n-1$ longlines where these are rotated so that a different $2^n-1$ subset is tappable in each of sequential tile regions of the FPGA.)

All configuration SRAM cells such as 431a, 431b, etc. are driven by a global reset line 470 which can reset all of these memory cells to the "0" state simultaneously, for example during power-up and FPGA reset. Each of the SRAM cells is further individually addressable by individual address lines such as the x and y lines (row select and bit line column) shown at 475 where the latter may be used for individually setting memory bits by means of individualized addressing.

Figure 5:
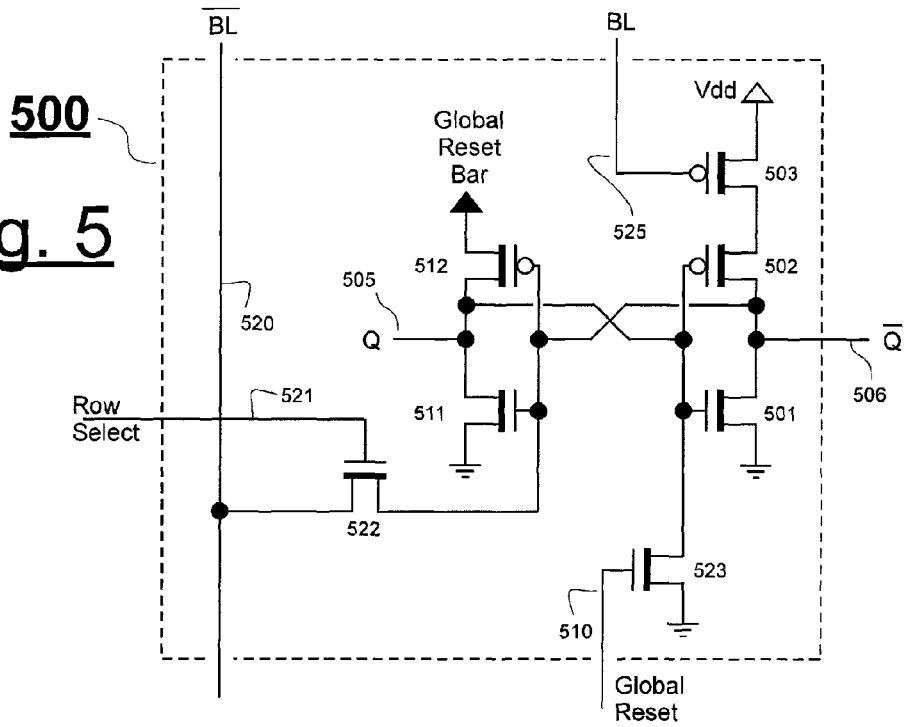
FIG. 5 is a schematic diagram of an SRAM memory cell usable in the circuit of FIG. 4.

FIG. 5 shows one design for a globally resettable SRAM cell 500 that may be used in the circuitry of FIG. 4. During power-up or reset, the global reset line 510 is asserted (driven high) to thereby turn on N transistor 523 and thus pull low the gates of N transistor 501 and P transistor 502. This in turn drives the Q-bar output 506 high, turns N transistor 511 on and thus drives the Q output terminal 505 of the cell low. At the same time that Global Reset 510 goes high, its complement, Global Reset Bar (connected to P transistor 512) goes low and thus prevents sourcing of current through P transistor 512 and into the pulled-low Q output terminal 505.

Flipping of the SRAM cell 500 to the set state (Q="1") happens when bit line BL (525) is driven high, BL-bar (520) is driven low and Row-Select (521) is driven high. The high bit line 525 (BL) turns P transistor 503 off and thus prevents its series connected next P transistor 502 from sourcing current to the Q-bar output terminal 508. The driven low BL-bar line (520) allows addressing transistor 522 to pull low the gates of N transistor 511 and P transistor 512 in response to Row Select 521 being high and to thus drive the Q output terminal 505 high when the SRAM cell 500 is selected for a bit setting operation. The row select 521 and bit line 520 (BL) are of course held low during global reset while BL-bar (525) is held high. Various other designs for the SRAM cell 500 may be used. This is merely an example.

Figure 6:
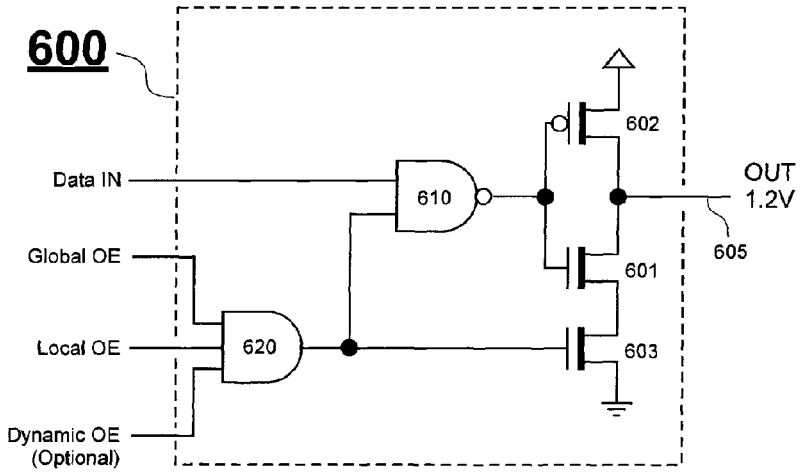
FIG. 6 is a schematic diagram of a longline driver usable in the circuit of FIG. 4.

FIG. 6 shows one design for a globally enabled longline driver 600 that may be used in the circuitry of FIG. 4. During power-up or reset, the global OE line is de-asserted (driven low) to thereby force the output of AND gate 620 low. This in turn switches N transistor 603 off and decouples the output terminal 605 from being able to sink a current to ground. The "0" output state of AND gate 620 also forces a "1" to be output from NAND gate 610. This in turn switches P transistor 602 off and decouples the output terminal 605 from being able to source a current out from the Vcc power rail (1.2V in one embodiment). Accordingly, the output terminal 605 is in a high impedance state (Hi-Z mode) when the global OE line is de-asserted (driven low). In the case where another tristate driver (not shown) drives output terminal 605 to 1.2V (a logic high in one embodiment), current leakage through N transistors 601 and 603 is minimized because the turned off transistor 603 forces the source of N transistor 601 to be at a relatively high voltage (e.g., above 0.6V) and it thus prevents N transistor 601 from crossing beyond turn-on threshold even though the gate of N transistor 601 is at about 1.2V. In other words, transistor 603 operates as a relatively large source follower resistance for N transistor 601 and thus bucks against increases of current flow through N transistor 601.

By contrast if all inputs (e.g., Global OE, Local OE and the optional dynamic OE) are driven high, then AND gate 620 output a logic "1" (high). This turns N transistor 603 on and creates a current sinking path to ground in the case where N transistor 601 is also turned on because Data IN is low and NAND gate 610 thus outputs a logic "1" to turn N transistor 601 on. In the case where the Data IN terminal instead goes high, NAND gate 610 outputs a logic "0" and this turns N transistor 601 off first (due to forward drop across 603) and then turns P transistor 602 on, thus driving the output terminal 605 to high. Various other designs for the LL driver 600 may be used. This is merely an example.

Referring back to FIG. 4, although the bus-accessing multiplexers (e.g., 433 . . . 439) each have just $2^n-1$ input terminals for selecting among the $2^n-1$ tappable longlines in the respective FPGA tile region, in one embodiment, additional general purpose of G-muxes are also provided in each tile region where the G-muxes (not shown) have a corresponding $2^m$ input terminals for their respective m selection bits (m=2, 3, 4, etc.) and the G-muxes respond to an additional and respective, output enabling configuration bit by switching into a High-R state for their inputs and outputs when the respective output enabling configuration bit is low. Thus the G-muxes (not shown) are also automatically placed into a low power mode by a global resetting of all configuration bits at the initiation of power up or device reset. The G-muxes however, each have input terminals that couple to source nodes other than just locally tappable longlines. In one embodiment, each G-mux has 16 input terminals, 4 configuration bits for input selection plus an additional output enable bit for power saving. Some of the input terminals among the 16 input terminals of each G-mux connect to non-longline nodes in neighboring tile regions.

The present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, use of equivalent functional couplings for couplings described herein, and/or use of equivalent functional steps for steps described herein. Such insubstantial variations are to be considered within the scope of what is contemplated here. Moreover, if plural examples are given for specific means, or steps, and extrapolation between and/or beyond such given examples is obvious in view of the present disclosure, then the disclosure is to be deemed as effectively disclosing and thus covering at least such extrapolations.

By way of an example, it is understood that the configuring of a PLD device such as 415 of FIG. 4 in accordance with the disclosure can include use of firmware in the programming control circuit 450 where the latter circuit 450 carries out part or most of the method 300 shown in FIG. 3. A variety of schemes may be used for organizing bit lines and row selects so as to try and minimize average time for setting all the configuration bits that need to be set after global reset. A computer (not shown) may be used organize the firmware operations of the programming control circuit 450 accordingly. A computer-readable medium such as a magnetic disk may be used for loading configuration data into the nonvolatile memory part of the FPGA for subsequent transfer after global reset and during each power up into the SRAM memory cells. Reduction of static power draw may entail setting of other specific patterns besides just that of resetting the input-selectors of unused longline drivers. In view of this, it is to be understood that it is within the scope of the present disclosure to design a programming control circuit 450 so as to speed the time for setting individual configuration bits so as to implement desired FPGA functions while still minimizing static current leakage and to design a computer-readable medium that provides the configuration data accordingly.

Reservation of Extra-Patent Rights, Resolution of Conflicts, and Interpretation of Terms After this disclosure is lawfully published, the owner of the present patent application has no objection to the reproduction by others of textual and graphic materials contained herein provided such reproduction is for the limited purpose of understanding the present disclosure of invention and of thereby promoting the useful arts and sciences. The owner does not however disclaim any other rights that may be lawfully associated with the disclosed materials, including but not limited to, copyrights in any computer program listings or art works or other works provided herein, and to trademark or trade dress rights that may be associated with coined terms or art works provided herein and to other otherwise-protectable subject matter included herein or otherwise derivable herefrom.

If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls.

Unless expressly stated otherwise herein, ordinary terms have their corresponding ordinary meanings within the respective contexts of their presentations, and ordinary terms of art have their corresponding regular meanings within the relevant technical arts and within the respective contexts of their presentations herein. Descriptions above regarding related technologies are not admissions that the technologies or possible relations between them were appreciated by artisans of ordinary skill in the areas of endeavor to which the present disclosure most closely pertains.

Given the above disclosure of general concepts and specific embodiments, the scope of protection sought is to be defined by the claims appended hereto. The issued claims are not to be taken as limiting Applicant's right to claim disclosed, but not yet literally claimed subject matter by way of one or more further applications including those filed pursuant to 35 U.S.C. §120 and/or 35 U.S.C. §251.

What is claimed is:

1. A programmable logic device (PLD) having a configurable interconnect structure including longline buses each having a plurality of longlines that each extends through a plurality of substantially repeating tile structures of the PLD, where the configurable interconnect structure is characterized by:

(a) each of the longlines having plural tristate drivers connected thereto and operable to drive that longline;

(b) each of the longline-driving tristate drivers having an input terminal, an output enabling terminal and an output terminal that is connected to the corresponding longline of that tristate driver;

(c) each of the longline-driving tristate drivers having a corresponding input signal selecting multiplexer coupled to the input terminal of that tristate driver, the input signal selecting multiplexer being operable to supply a selected one of one or more input signals received by the input signal selecting multiplexer, if any are received, to the corresponding input terminal of the tristate driver;

(d) each input signal selecting multiplexer being responsive to a respective input selecting signal that is conveyable to that input signal selecting multiplexer, where the input selecting signal can represent $2^n$ unique selection states, where n is a whole number greater than 1;

(e) each input signal selecting multiplexer of a respective tristate driver having a plurality of, but no more than $2^n-1$ usable input terminals to which respective input signals can be supplied for selective routing thereof through the input signal selecting multiplexer to the input terminal of the corresponding tristate driver in accordance with the respective input selecting signal of that input signal selecting multiplexer;

(f) each input signal selecting multiplexer being structured such that a predetermined one of the $2^n$ unique selection states is a no-usable-input-selected state wherein none of the no more than $2^n-1$ usable input terminals of that multiplexer is selected; and (g) the output enabling terminal of each longline-driving tristate driver is controlled by a respective output enabling circuit that is responsive to the respective input selecting signal of the corresponding input signal selecting multiplexer of that tristate driver, where the respective output enabling circuit is structured to prevent the corresponding tristate driver from being in a signal outputting state other than a high impedance (Hi-Z) output state when respective input selecting signal represents said no-usable-input-selected state.

2. The PLD of claim 1 where said configurable interconnect structure is further characterized by:

said no-usable-input-selected state being defined by the input selecting signal digitally representing an all bits being zeroed state;

the PLD has a plurality of configuration memory cells which are globally resettable to an every configuration memory cell being zeroed state; and at least a subset of the configuration memory cells are operatively coupled to the input signal selecting multiplexers of the longline tristate drivers of the PLD so as to define the respective input selecting signals of those input signal selecting multiplexers.

3. The PLD of claim 1 where said respective output enabling circuits of the respective tristate drivers are each operatively coupled so as to be globally driven by a global output enable signal and are each structured to responsively force their corresponding tristate driver into a globally forced Hi-Z output state when the global output enable signal is de-asserted.

4. The PLD of claim 1 where said configurable interconnect structure is further characterized by:

the up to $2^n-1$ usable input terminals of each input signal selecting multiplexer within a subset of the input signal selecting multiplexers being respectively connected to a corresponding number of adjacent and locally tappable longlines of an adjacent longlines bus, whereby the input signal selecting multiplexer of said subset is defined as a longlines bus accessing multiplexer.

5. The PLD of claim 4 where each of the longlines buses that is accessed by one or more of said longlines bus accessing multiplexers consists of $2^n-1$ longlines.

6. The PLD of claim 4 where the longlines are each a 12-span longline or longer that spans from a first end tile to a corresponding 12 or more further tile structures of the PLD.

7. The PLD of claim 1 where the PLD includes a field programmable gate array (FPGA).

8. The PLD of claim 1 wherein:

each of the longline-driving tristate drivers has a complementary output structure coupled to the output terminal of the tristate driver, the complementary output structure including a current sourcing transistor and a current sinking transistor; and each of the longline-driving tristate drivers has output disabling logic configured to disable each of the current sourcing transistor and the current sinking transistor from conducting current in response to the output enabling terminal of the tristate driver not receiving and output enabling signal from said respective output enabling circuit of the tristate driver.

9. The PLD of claim 8 wherein:

output disabling logic of each longline-driving tristate driver includes AND gate logic and NAND gate logic coupled one to the next, the AND gate logic and the NAND gate logic also being coupled to drive the current sinking transistor and the current sourcing transistor of the tristate driver;

a first of the AND gate and the NAND gate logics being responsive to a data signal supplied to the input terminal of the tristate driver; and a second of the AND gate and the NAND gate logics being responsive both to the respective output enabling circuit of the tristate driver and to a global output enabling signal of a global OE line of the PLD.

10. The PLD of claim 8 wherein:

the PLD includes a global OE line operatively coupled to supply a corresponding global output enabling signal; and said output disabling logic of each longline-driving tristate driver is configured to additionally disable each of the current sourcing transistor and the current sinking transistor of the tristate driver from conducting current in response to the global OE line not supplying a corresponding global output enabling signal to the output disabling logic.

11. The PLD of claim 10 wherein:

said output disabling logic of each longline-driving tristate driver is configured to additionally disable each of the current sourcing transistor and the current sinking transistor of the tristate driver from conducting current in response to a dynamic output enabling signal not being provided in an asserting form (an output enabling form) to the output disabling logic.

12. The PLD of claim 1 wherein each input signal selecting multiplexer has:

a plurality of switchable resistance elements coupled substantially in the form of a binary tree between the no more than $2^n-1$ usable input terminals of the multiplexer and a selection outputting terminal of the multiplexer, where the switchable resistance elements are each switchable between a relatively low resistance mode (Low-R) and a substantially higher resistance mode (High-R); and a resistance elements controlling circuit coupled to the switchable resistance elements and configured to form a relatively low resistance pathway between a selected one of the no more than $2^n-1$ usable input terminals of the multiplexer and the selection outputting terminal when the respective input selecting signal of the multiplexer indicates selection of the selected one of the no more than $2^n-1$ usable input terminals, where the resistance elements controlling circuit is further configured to not form a relatively low resistance pathway between any of the no more than $2^n-1$ usable input terminals of the multiplexer and the selection outputting terminal when the respective input selecting signal represents the no-usable-input-selected state.

13. The PLD of claim 12 wherein each switchable resistance element includes a transmission gate.

14. The PLD of claim 12 wherein each switchable resistance element includes a pass transistor.

15. The PLD of claim 12 wherein:

each given one of the no more than $2^n-1$ usable input terminals of the respective multiplexer is coupled in series to a corresponding, first column switchable resistance element such that causing that corresponding first column switchable resistance element of the given usable input terminal to be in the higher resistance mode (High-R) forces leakage current ($I_{Leak}$) flowing between the given usable input terminal and any others of the no more than $2^n-1$ usable input terminals to flow through the corresponding first column switchable resistance element of the given usable input terminal; and the resistance elements controlling circuit is further configured to respond to the no-usable-input-selected state by causing all the first column switchable resistance elements of the respective multiplexer to be in the higher resistance mode (High-R).

16. The PLD of claim 1 and further comprising a plurality of configuration memory cells, wherein each input signal selecting multiplexer receives its respective input selecting signal from a corresponding subset of the configuration memory cells;

each configuration memory cell includes a nonvolatile memory part and a corresponding volatile memory part, where the volatile memory part can be programmed with data transferred thereto from the nonvolatile memory part; and where the volatile memory part is responsive to a global control signal of the PLD that, when asserted, places all volatile memory parts in respective states corresponding to the no-usable-input-selected state.

17. The PLD of claim 16 wherein the no-usable-input-selected state is represented by an all zeroed digital signal and the global control signal is a global reset signal that, when asserted, places all the volatile memory parts of the PLD each into a zeroed state.

18. The PLD of claim 1 wherein:

at least one of the corresponding input signal selecting multiplexers of a given first longline-driving tristate driver that is connected to drive a respective longline in a corresponding first longlines bus is also connected to function as a longlines accessing multiplexer for one or more longlines of a second longlines bus, where said longlines accessing function includes accessing a signal of an accessed longline in the second longlines bus for potential selective routing of that accessed signal to first longline-driving tristate driver.

19. The PLD of claim 1 wherein said configurable interconnect structure is further characterized by:

each of said plurality of longlines belongs to a corresponding longlines bus that has at least $2^{n'}-1$ such longlines extending through the PLD, where n' is a whole number greater than 1; and each given longlines bus has a plurality of bus-accessing multiplexers operatively coupled thereto, each of the bus-accessing multiplexers being configured to selectively access a selectable signal from a corresponding $2^{n'}-1$ locally tappable longlines of the given longlines bus, where each bus-accessing multiplexer of the given longlines bus is controlled by a corresponding access selection defining signal that can represent $2^{n'}$ unique states, but the respective bus-accessing multiplexer has no more than $2^{n'}-1$ usable bus-accessing input terminals, and where each bus-accessing multiplexer is structured such that a predetermined one of the $2^{n'}$ unique selection states of the access selection defining signal is a no-usable-access-point selected state wherein none of the no more than $2^{n'}-1$ usable bus-accessing input terminals of that bus-accessing multiplexer is selected; and where n' can be equal to n and one or more of the tristate input signal selecting multiplexers can also serve as a bus-accessing multiplexer for a different longlines bus than the longlines bus whose longline is drivable by the corresponding tristate driver of the multiplexer that serves both as a tristate input signal selecting multiplexer and as a bus-accessing multiplexer.

20. The PLD of claim 19 where the condition of the access selection defining signal representing the predetermined no-usable-access-point selected state causes the corresponding bus-accessing multiplexer to present a relatively high resistance (Hi-R) at each of its no more than $2^{n'}-1$ usable bus-accessing input terminals.

21. The PLD of claim 19 where those of the input signal selecting multiplexers that do not also serve as bus-accessing multiplexers also present a relatively high resistance (Hi-R) at each of their no more than $2^{n}-1$ usable input terminals when the predetermined no-usable-input selected state is indicated by their respective input selecting signals.

22. The PLD of claim 19 where there is at least one bus-accessing multiplexer in each of the tiles spanned by at least one of the given longlines buses.

23. The PLD of claim 19 and further comprising:

a plurality of general purpose interconnect multiplexers (G-Muxes) each having a respective number of $2^{m}$ usable input terminals where m is a whole number greater than 1, where the G-Muxes are responsive to selection control signals supplied thereto and indicating, which, if any, of their $2^{m}$ usable input terminals is to operate as a selected input terminal whose signal is to be operatively coupled to an output terminal of the respective G-Mux, and where the G-Muxes are further each responsive to a corresponding input-and-output enabling configuration signal, which when de-asserted causes the $2^{m}$ usable input terminals and the output terminal of the respective G-Mux to switch into a relatively high resistance mode (Hi-R) whereby possibility of substantial leakage currents flowing between the $2^{m}$ usable input terminals of the so-disabled G-Mux is substantially reduced and possibility of the $2^{m}$ usable input terminals of the so-disabled G-Mux capacitively loading nodes to which they are connected is substantially reduced.

24. The PLD of claim 23 wherein the input-and-output enabling configuration signal of each G-Mux is automatically de-asserted by a global reset signal applied to the configuration memory of the PLD.

25. The PLD of claim 23 wherein the G-Muxes are disposed in repeated tile structures of the PLD and at least one input terminal of each given G-Mux connects to a tap node within a tile structure other than the tile structure of the given G-Mux.

26. A programmable logic device (PLD) formed as part of a monolithically integrated circuit and comprising:

a first plurality of input selective first components each having a respective plurality of first input terminals and a respective input selecting capability whereby the first component can select a subset from among a set of input signals received by its respective plurality of first input terminals;

a second plurality of selection signal conveying lines that are operatively coupled to convey corresponding first input selecting signals to corresponding ones of the input selective first components, where each of the first components is configured to select its respective subset of input signals in accordance with the first input selecting signal conveyed thereto, where each of the first input selecting signals represents a respective plurality of bits that, when they are all used within the PLD, are capable of defining $2^{n}$ unique states, where n is a whole number greater than 1; and a global selection establishing circuit that is structured to be selectively activated, and when activated, to cause all the first input selecting signals to represent a predetermined one among the $2^n$ unique states;

wherein each of the input selective first components has no more than $2^n-1$ usable input terminals as its respective plurality of first input terminals, and wherein each of the input selective first components automatically responds to the predetermined one of the $2^n$ unique states being represented by its first input selecting signal, by switching into a no-usable-input-selected state wherein the input selective first component does not use any of the up to $2^n-1$ input signals that may be present on its no more than $2^n-1$ usable input terminals.

27. The PLD of claim 26 and further comprising:

a plurality of multi-line buses each having a respective plurality of lines;

wherein the first plurality of input selective first components includes a plurality of bus-accessing multiplexers each having at least a subset of its no more than $2^n-1$ usable input terminals connected to a corresponding bus line of a corresponding one of the multi line buses;

wherein when each of the bus-accessing multiplexers switches to its no-usable-input-selected state, it presents a relatively high impedance at each of its no more than $2^n-1$ usable input terminals so as to thereby substantially not capacitively load the bus lines to which it is connected when it is in the no-usable-input-selected state; and wherein when each of the bus-accessing multiplexers is instead in a usable-input-selected state for which at least one of its usable input terminals is selected, the bus-accessing multiplexer presents a substantially lower impedance at its selected at least one usable input terminal where the lower impedance effectively couples a capacitive load of an opposed end thereof to the selected usable input terminal.

28. The PLD of claim 26 and further comprising:

an interconnect structure including a plurality of multi-line tristate buses each having a respective plurality of tristate lines, the interconnect structure having plural signal extraction nodes from which signals conveyed by the interconnect structure can be extracted and the interconnect structure having plural signal injection nodes into which signals can be injected for conveyance by the interconnect structure;

a plurality of tristate bus drivers each having a tristateable output connected to a signal injection node of a corresponding tristate line;

wherein the first plurality of input selective first components includes a plurality of tristate-bus-driver input selecting multiplexers each having an output thereof coupled to an input of a corresponding one of the tristate-bus-drivers, wherein each of the input selecting multiplexers has at least a subset of its no more than $2^n-1$ usable input terminals connected to different signal extraction nodes of the interconnect structure;

wherein when each of the input selecting multiplexers switches to its no-usable-input-selected state, it presents a relatively high impedance at its each of its no more than $2^n-1$ usable input terminals so as to thereby substantially not capacitively load the signal extraction nodes of the interconnect structure to which it is connected when it is in the no-usable-input-selected state; and wherein when each of the input selecting multiplexers is instead in a usable-input-selected state for which at least one of its usable input terminals is selected, the bus-accessing multiplexer presents a substantially lower impedance at its selected at least one usable input terminal where the lower impedance can then effectively couple a capacitive load of an opposed end thereof to the selected usable input terminal.

29. The PLD of claim 28 wherein:

each tristate bus driver that has a corresponding one of the input selecting multiplexers coupled to the tristate bus driver for driving the tristate bus driver, also has a corresponding output enabling circuit that is responsive to the first input selecting signal of the corresponding input selecting multiplexer and that is structured to switch the output of the tristate bus driver between a driving mode and a high impedance (Hi-Z) mode;

wherein the corresponding output enabling circuit of each tristate bus driver with a corresponding input selecting multiplexer is configured to switch the output of the tristate bus driver to the Hi-Z mode when the first input selecting signal of the corresponding input selecting multiplexer indicates the no-usable-input-selected state.

30. The PLD of claim 29 wherein:

the PLD includes a global disabling circuit configured to selectively output a global output disable signal indicating that the outputs of all the tristate bus drivers of the PLD should be switched into their respective Hi-Z modes; and wherein the corresponding output enabling circuit of each tristate bus driver with a corresponding input selecting multiplexer is further configured to switch the output of the tristate bus driver to the Hi-Z mode when the global output disable signal is asserted.

31. The PLD of claim 30 wherein:

the PLD includes a programmable configuration memory having plural memory cells, each memory cell having a configuration data outputting part and a reprogrammable configuration data storing part coupled to supply stored configuration data to its respective configuration data outputting part;

the PLD includes a global configuration state establishing circuit configured to selectively output a global configuration data establishing signal indicating that the configuration data outputting parts of all the configuration memory cells should be switched into states representing the no-usable-input-selected state; and the configuration data outputting parts of the programmable configuration memory are configured to respond to assertion of the global configuration data establishing signal by outputting configuration data representing the no-usable-input-selected state;

wherein the input selecting multiplexers receive their respective first input selecting signals from corresponding ones of the configuration data outputting parts that output configuration data representing the no-usable-input-selected state when the global configuration data establishing signal is asserted.

32. The PLD of claim 31 wherein:

the PLD includes a configuration bits programming circuit that is configured to sequentially supply configuration data to selectable subsets of the reprogrammable configuration data storing parts of the PLD;

wherein the PLD configuration bits programming circuit is configured to automatically cause the global configuration state establishing circuit to temporarily assert the global configuration data establishing signal before new configuration data is programmed into selected subsets of the reprogrammable configuration data storing parts; and wherein the PLD configuration bits programming circuit is configured to automatically cause the global disabling circuit to assert the global output disable signal while new configuration data is being programmed into the selected subsets of the reprogrammable configuration data storing parts.

33. The PLD of claim 32 wherein:

wherein the PLD configuration bits programming circuit is configured to automatically cause the global disabling circuit to de-assert the global output disable signal when new configuration data is finished being programmed into the selected subsets of the reprogrammable configuration data storing parts and the corresponding configuration data outputting parts of the programmable configuration memory are then outputting the newly programmed data of the selected subsets of the reprogrammable configuration data storing parts.

34. The PLD of claim 33 wherein the configuration bits programming circuit is configured to fetch the new configuration data that is to be sequentially supplied to selectable subsets of the reprogrammable configuration data storing parts of the PLD from a nonvolatile configuration data storing part also formed on the monolithically integrated circuit together with the PLD.

35. A machine-implemented and automated method of configuring a programmable logic device (PLD) that is formed as part of a monolithically integrated circuit, where the to-be-configured PLD has:

a reconfigurable memory that can store supplied configuration data;

a first plurality of input selective first components each having a respective plurality of first input terminals and a respective input selecting capability whereby the first component can select a subset from among a set of input signals received by its respective plurality of first input terminals;

a second plurality of selection signal conveying lines that are operatively coupled to the reconfigurable memory so as to convey from the reconfigurable memory, corresponding first input selecting signals to corresponding ones of the input selective first components, where each of the first components is thereby configured to select its respective subset of input signals in accordance with the first input selecting signal conveyed thereto, where each of the first input selecting signals represents a respective plurality of bits that, when they are all used within the PLD, are capable of defining $2^n$ unique states, where n is a whole number greater than 1;

a plurality of tristate drivers each having a tristateable output terminal, an output enabling terminal that can switch the tristateable output terminal into a high impedance (Hi-Z) mode, and a tristate driver input terminal;

a global selection establishing circuit that is structured to be selectively activated, and when activated, to cause all the first input selecting signals to represent a predetermined one among the $2^n$ unique states; and a global disabling circuit that is commandable to selectively output a global output disable signal which causes the outputs of all the tristate drivers of the PLD to be switched into their respective Hi-Z modes;

wherein each of the input selective first components has no more than $2^n-1$ usable input terminals as its respective plurality of first input terminals, and wherein each of the input selective first components automatically responds to the predetermined one of the $2^n$ unique states being represented by its first input selecting signal, by switching into a no-usable-input-selected state wherein the input selective first component does not use any of the up to $2^n-1$ input signals that may be present on its no more than $2^n-1$ usable input terminals;

said automated method comprising:

detecting a machine state that is predetermined to indicate a start of a reconfiguration operation for the PLD;

in response to said detecting, commanding the global disabling circuit to selectively output the global output disable signal which causes the outputs of all the tristate drivers of the PLD to be switched into their respective Hi-Z modes;

in response to said detecting, temporarily activating and then deactivating the global selection establishing circuit so as to thereby globally configure at least those parts of the reconfigurable memory that supply the first input selecting signals to states respectively representing the no-usable-input-selected state so as to thereby cause all the respective first input selecting signals to represent the no-usable-input-selected state; and after said temporary activating and deactivating of the global selection establishing circuit, selectively altering the configuration states of one or more of the reconfigurable memory parts that supply the first input selecting signals to states other than those representing the no-usable-input-selected state.

36. The automated PLD configuring method of claim 35 wherein:

the no-usable-input-selected state is represented by digital data defining all its bits as logically zeroed bits; and the global selection establishing circuit, when activated, resets at least the reconfigurable memory parts that supply the first input selecting signals to states representing digital data having all its corresponding bits reset to logical zero.

37. The automated PLD configuring method of claim 35 wherein:

a first machine state that is predetermined to indicate a start of a reconfiguration operation for the PLD is a power up state.

38. The automated PLD configuring method of claim 35 and further comprising:

determining if completion has been achieved at least for said selective altering of the configuration states of one or more of the reconfigurable memory parts that supply the first input selecting signals to states other than those representing the no-usable-input-selected state; and in response to the determining of completion, commanding the global disabling circuit to discontinue its output of the global output disable signal.

*39. A programmable logic device (PLD) comprising: at least one conductor; at least one tristate driver having an input terminal, an output enabling terminal, and an output terminal, the output terminal connected to the conductor; a multiplexer having a plurality of input terminals, at least one input selection terminal, and an output terminal, the output terminal connected to the input terminal of the tristate driver; and an output enabling circuit coupled to the output enabling terminal of the tristate driver and responsive to an input selecting signal applied to the input selection terminal of the multiplexer, wherein the output enabling circuit is structured to prevent the tristate driver from being in signal outputting state other than a high impedance (Hi-Z) output state when the input selecting signal selects none of the multiplexer input terminals.*

*40. The PLD of claim 39, wherein the output enabling circuit is structured to enable the tristate driver if the input selecting signal selects one of the multiplexer input terminals.*

*41. The PLD of claim 39, wherein the multiplexer has at least two input selection terminals and at least three input terminals.*

*42. The PLD of claim 39, wherein: the multiplexer has n input selection terminals and no more than 2n-1 input terminals; and n is a whole number greater than 1.*

*43. The PLD of claim 39, wherein the conductor is a longline.*

*44. The PLD of claim 43, wherein the longline extends across a plurality of substantially repeating tile structures of the PLD.*

*45. The PLD of claim 43, including a plurality of tristate drivers connected to the longline.*

*46. The PLD of claim 39, wherein the output enabling circuit comprises a logic OR circuit coupled between the output enabling terminal of the tristate driver and configuration memory bits for storing the input selecting signal applied to the input selection terminal of the multiplexer.*

*47. A method of configuring a programmable logic device (PLD) comprising: providing at least one conductor; providing at least one tristate driver having an output enabling terminal, an input terminal and an output terminal, the output terminal connected to the conductor; providing a multiplexer having a plurality of input terminals, at least one input selection terminal, and an output terminal, the output terminal connected to the input terminal of the tristate driver; providing an input selecting signal to the multiplexer input selection terminal; providing an output enabling circuit coupled to the output enabling terminal of the tristate driver, the circuit responsive to an input selecting signal from configuration memory bits for the input selection terminal of the multiplexer; and setting the configuration memory bits to a first logic state to generate an input selecting signal that selects none of the multiplexer input terminals, wherein the output enabling circuit in response to the input selecting signal disables the tristate driver to a high impedance (Hi-Z) output state in response to an input selecting signal that selects none of the multiplexer input terminals, disabling the tristate driver to a high impedance (Hi Z) output state.*

*48. The method of claim 47, wherein disabling the tristate driver to a high impedance (Hi-Z) output state includes maintaining the tristate driver in a high impedance (Hi-Z) output state.*

*49. The method of claim 47 including: setting the configuration memory bits to a second logic state to generate an input selecting signal that selects one of the multiplexer input terminals, wherein the output enabling circuit in response to the input selecting signal enables the tristate driver.*

* * * * *